United States Patent [19]

Matsuo et al.

[11] Patent Number: 4,859,970
[45] Date of Patent: Aug. 22, 1989

[54] VOLTAGE CONTROLLED OSCILLATOR

[75] Inventors: Kenji Matsuo; Ikuo Tsuchiya, both of Yokohama, Japan

[73] Assignee: Kabushiki Kaisha Toshiba, Kawasaki, Japan

[21] Appl. No.: 277,108

[22] Filed: Nov. 29, 1988

[30] Foreign Application Priority Data

Nov. 30, 1987 [JP] Japan .................. 62-302700
Jun. 29, 1988 [JP] Japan .................. 63-161345

[51] Int. Cl.$^4$ .............................................. H03B 1/00
[52] U.S. Cl. .......................................... 331/57; 331/25
[58] Field of Search ............... 331/2, 10, 18, 25, 57, 331/135

[56] References Cited

U.S. PATENT DOCUMENTS 4,091,335 5/1978 Giolma et al. ............... 331/57 X
4,358,728 11/1982 Hashimoto ................... 331/57 X

OTHER PUBLICATIONS

Deog-Kyoon Jeong et al., "Design of PLL-Based Clock Generation Circuits," IEEE Journal of Solid-State Circuits, vol. SC-22, No. 2, pp. 255-261, Apr. 1987.

Primary Examiner—Eugene R. Laroche
Assistant Examiner—Robert J. Pascal
Attorney, Agent, or Firm—Finnegan, Henderson, Farabow, Garrett, & Dunner

[57] ABSTRACT

A voltage controlled oscillator comprises a phase locked loop section and a voltage controlled oscillator section. The phase locked loop section is coupled with an input signal at a reference frequency and a reference potential, and performs a signal feedback control so as to obtain a constant delay time of a first variable delay circuit contained in the phase locked loop section. The voltage controlled oscillator section controls a delay time of a second variable delay circuit in a ring oscillator by a control input voltage and an output voltage of a low-pass filter contained in the phase locked loop section, and produces a signal oscillating at a frequency as determined by the delay time. In the voltage controlled oscillator thus arranged, the output frequency is determined by controlling a delay time of the second variable delay circuit in the voltage controlled oscillator section. Since the delay time is accurately controlled by the phase locked loop section, the obtained output frequency is stable against the variance of the process parameters. Since the delay time is varied by the reference frequency of the input signal, the output frequency may be set at a desired frequency, and hence a frequency band of the oscillation frequencies may also be set appropriately.

10 Claims, 6 Drawing Sheets

VOLTAGE CONTROLLED OSCILLATOR

BACKGROUND OF THE INVENTION

1. Field of the Invention

This invention relates to a voltage controlled oscillator (VCO) fabricated into a semiconductor integrated circuit, which is suitably used for a phase locked loop (PLL).

2. Description of the Related Art

Figure 1:
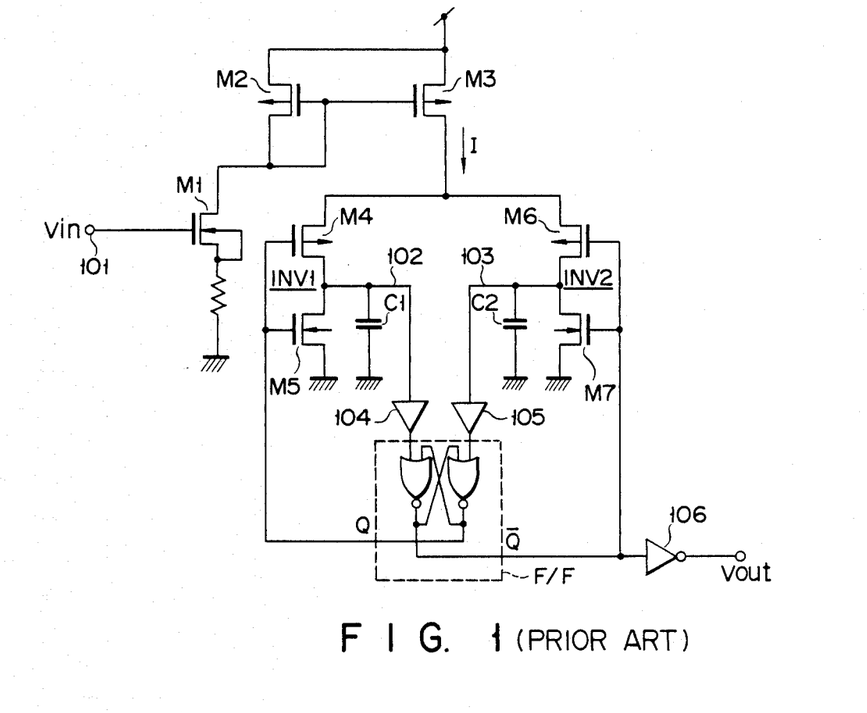
FIG. 1 is a circuit diagram showing a conventional voltage controlled oscillator.

A conventional VCO is disclosed in Japanese Patent Application Laid-Open Publication No. 59-62215, which is arranged as shown in FIG. 1. In the figure, reference numeral 101 designates an input terminal for control voltage Vin, and M1 designates an input N channel MOS transistor. P channel MOS transistors M2 and M3 make up a current mirror load circuit. P channel MOS transistor M4 and N channel MOS transistor M5 make up a first CMOS inverter INV1, with first capacitor C1 being connected between the output terminal 102 and ground. P channel MOS transistor M6 and N channel MOS transistor M7 cooperate to form a second CMOS inverter INV2, with second capacitor C2 being connected between the output terminal 103 and ground. First voltage comparator 104 is connected to the output terminal 102 of first CMOS inverter INV1, while second voltage comparator 105 is coupled with the output terminal 103 of second CMOS inverter INV2. The output terminals of voltage comparators 104 and 105 are respectively connected to the reset and set input terminals of RS flip-flop F/F. The set and reset output terminals Q and $\overline{Q}$ of this flip-flop F/F are respectively connected to the input terminals of first and second CMOS inverters INV1 and INV2. The output signal from reset output terminal $\overline{Q}$ is inverted by inverter 106, and output as output voltage Vout.

The operation of the VCO of FIG. 1 thus arranged will be described in brief. An input current, which depends on control input voltage Vin, flows through input transistor M1. A current, which is equal to the input current, is fed by output transistor M3 of the current mirror circuit into CMOS inverters INV1 and INV2. In an initial state, if the output terminals Q and $\overline{Q}$ of the flip-flop F/F are respectively low "L" in level and high "H" in level, transistors M4 and M7 are turned on, whereas transistors M5 and M6 are turned off. Under this condition, current I from current source transistor M3 charges first capacitor C1 through the transistor M4 being now in an on state. When the terminal voltage across first capacitor C1 exceeds threshold voltage Vth1 of voltage comparator 104, the output of first voltage comparator 104 becomes high in level, and the output logic level of flip-flop F/F is inverted so that the output signals of the flip-flop F/F are "H" and "L", respectively. Therefore, the transistors M4 and M7 in first and second CMOS inverters INV1 and INV2 are turned off, and the transistors M5 and M6 are turned on. As a result, current I charges second capacitor C2 through the transistor M6 being now in an on state. The charges in first capacitor C1 are discharged through transistor M5 to a ground terminal. When the terminal voltage across second capacitor C2 exceeds the threshold voltage Vth2 (=Vth1) of second voltage comparator 105, the output of second voltage comparator 105 becomes high in level, the output logic level of flip-flop F/F is inverted so that the output signals of the flip-flop F/F are "L" and "H", respectively. Therefore, the transistors M4 and M7 are returned in their operation state to an on state, and the transistors M5 and M6 are returned to an off state. A sequence of the above operations is repeated, so that voltage Vout at a frequency, which depends on the repeated operation, appears at the output terminal of inverter 106. The oscillating frequency f is given by $$f = 1/2CVref \qquad (1)$$

where C is capacitance of each of capacitors C1 and C2 (C=C1=C2), and Vref=threshold voltage of each of voltage comparators 104 and 105. (Vref=Vth1=Vth2). In fabricating the VCO into an LSI (large scale integrated circuit), a variance in process parameters is inevitable. The parameter variance leads to variances in the gate length of MOS transistors, threshold value, and gate oxide film thickness of the fabricated MOS transistors. Therefore, those factors C and Vref in the equation (1) greatly vary, and consequently the output frequency "f" also greatly varies. When such a VCO is incorporated into a PLL system, the characteristics of the PLL system may be degraded, and the production yield of the systems is also reduced.

SUMMARY OF THE INVENTION

In order to solve the problems that an output frequency of a VCO varies due to a variance of the process parameters, and the production yield of the systems based on the VCOs is reduced, the present invention has an object to provide a voltage controlled oscillator of which the output frequency is stable against the variance of the process parameters and may be set at a desired frequency.

According to the present invention, there is provided a voltage controlled oscillator comprising:

a phase locked loop section coupled with an input signal at a reference frequency and a reference potential, said phase locked loop section performing a signal feedback control so as to obtain a constant delay time of a first variable delay circuit contained in said phase locked loop section; and a voltage controlled oscillator section for controlling a delay time of a second variable delay circuit in a ring oscillator by a control input voltage and an output voltage of a low-pass filter contained in said phase locked loop section, and producing a signal oscillating at a frequency as determined by the delay time.

According to the present invention, there is further provided a voltage controlled oscillator comprising:

a phase locked loop including a first variable delay circuit coupled for reception with an input signal at a reference frequency, a phase comparing means for comparing the output signal of said first variable delay circuit and said input signal, and outputting an output voltage according to the comparison result, and a feedback circuit for applying said output voltage and said reference potential to said first variable delay circuit, thereby to control a delay of said first variable delay circuit;

a voltage controlled oscillator section including a ring oscillator for producing a frequency output, said ring oscillator containing a second variable delay circuit, and a feedback loop for applying the output voltage of said phase comparing means and the control voltage to said second variable delay circuit, thereby to control a delay time of said second variable delay circuit.

According to the present invention, there is still further provided a voltage controlled oscillator comprising:

a phase locked loop including a first variable delay circuit coupled for reception with an input signal at a reference frequency, a phase comparing means for comparing the output signal of said first variable delay circuit and said input signal, and outputting an output voltage according to the comparison result, and a feedback loop for level converting said output voltage and said reference potential and applying the level converted output signals to said first variable delay circuit, thereby to control a delay time of said first variable delay circuit;

a voltage controlled oscillator section including a ring oscillator for producing a frequency output, said ring oscillator containing a second variable delay circuit, and a feedback loop for level converting said output voltage and said reference potential and applying the level converted output signals to said second variable delay circuit, thereby to control a delay of said second variable delay circuit.

In the voltage controlled oscillator thus arranged, the output frequency is determined by controlling a delay time of the second variable delay circuit in the voltage controlled oscillator section. Since the delay time is accurately controlled by the phase locked loop section, the obtained output frequency is stable against the variance of the process parameters. Since the delay time is varied by the reference frequency of the input signal, the output frequency may be set at a desired frequency, and hence a frequency band of the oscillation frequencies may also be set appropriately.

DETAILED DESCRIPTION OF THE PREFERRED EMBODIMENTS

An embodiment of the present invention will be described with reference to the accompanying drawings.

Figure 2:
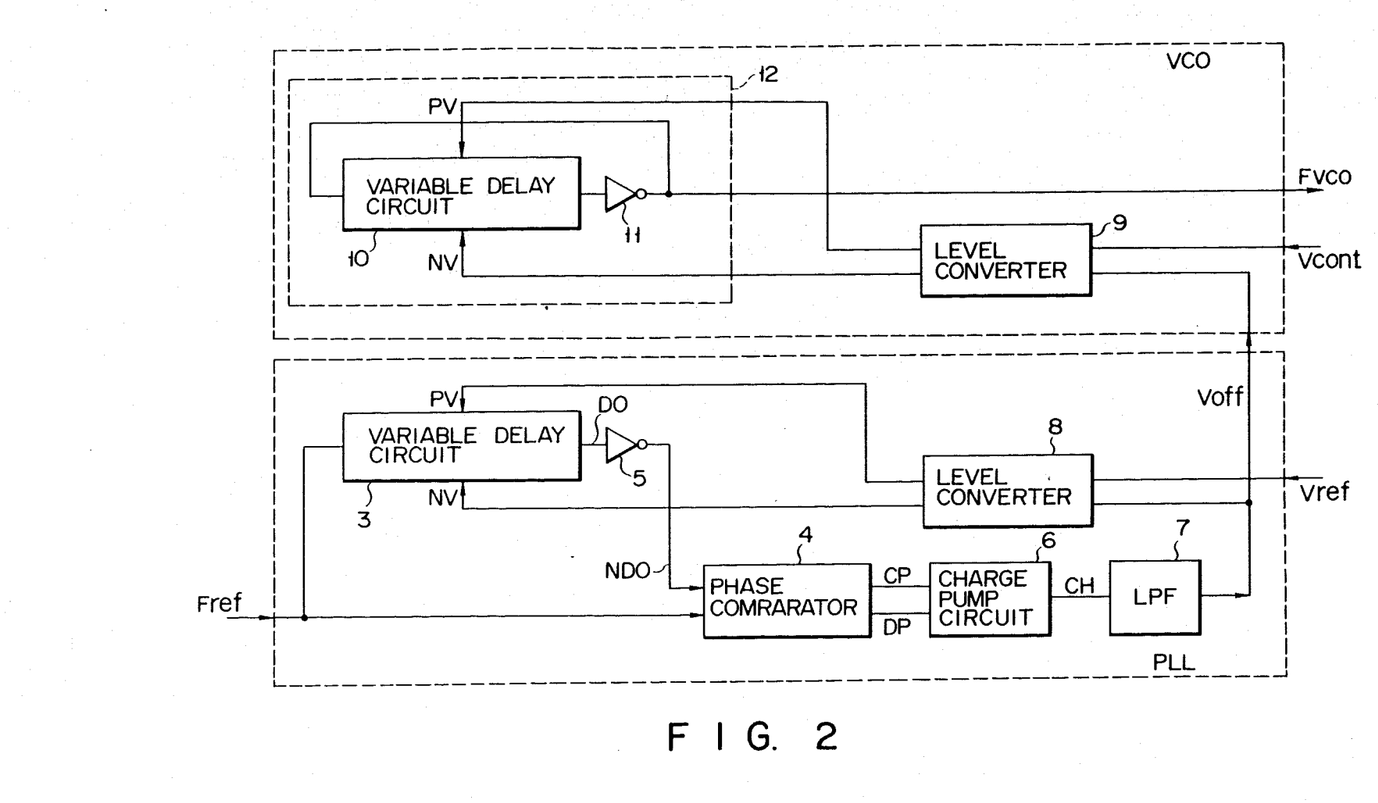
FIG. 2 is a block diagram showing a voltage controlled oscillator according to an embodiment of the present invention.

A VCO shown in FIG. 2 is formed on an LSI chip, and reference numeral 1 designates a PLL section and reference numeral 2 designates a VCO section. PLL section is coupled for reception with an input signal at reference frequency Fref and reference voltage Vref. In PLL section 1, a feedback control is performed so that a delay time in a delay circuit in a PLL loop is maintained at a constant value (e.g., ½ of the period of reference frequency Fref).

VCO section 2 is coupled for reception with control voltage Vcont and an output voltage Voff of a low-pass filter contained in a phase locked loop of PLL section 1. In VCO section 2, output frequency Fvco is determined through the control of a delay time of a ring oscillator using a delay circuit by the control voltage Vcont.

PLL section 1 will be described in detail. Reference input signal Fref is input to first variable delay circuit 3 and phase comparator 4. The output signal DO of this variable delay circuit 3 is applied to first inverter 5. In this inverter, it is level converted into a signal NDO. The signal NDO is applied to phase comparator 4. This comparator compares two input signals, reference input signal Fref and signal NDO, and controls first output signal CP and second output DP according to the comparison result. These two outputs CP and DP are input to charge pump circuit 6. The output signal Vp of the pump circuit is input to low-pass filter 7. The output voltage Voff of low-pass filter 7 and reference voltage Vref are input to first level converter 8. The level converter 8 compares two input signals, voltages Voff and Vref, and controls first and second output voltages PV and NV according to the comparison result. These output voltages PV and NV are applied to variable delay control circuit 3, and controls an amount of delay of variable delay circuit 3.

VCO section 2 will be described in detail. The output voltage signal Voff of low-pass filter 7 and control voltage Vcont are input to second level converter 9. First and second output voltage signals PV and NV of this level converter 9 are applied to ring oscillator 12 made up of second variable delay circuit 10 and second inverter 11, which are connected in a ring fashion. These signals are for controlling an amount of delay of the ring oscillator. Second level converter 9, second variable delay circuit 10, and second inverter 11 have the same circuit constructions as those of first level converter 8, first variable delay circuit 3, and first inverter 5.

Figure 3:
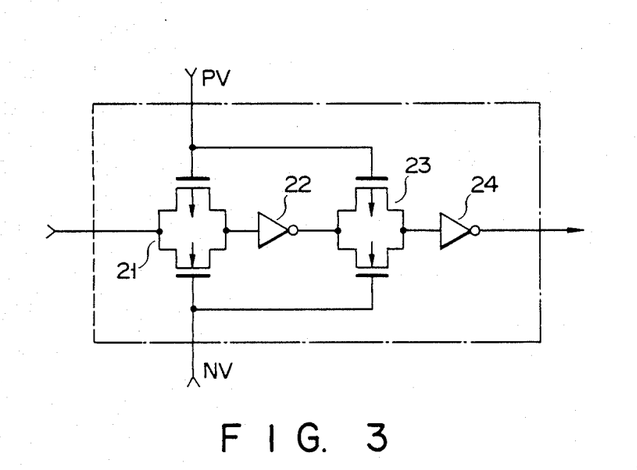
FIG. 3 is a circuit diagram showing the details of a basic delay circuit of one stage in a variable delay circuit in FIG. 2.

Variable delay circuits 3 and 10 are each made up of a predetermined number of basic circuits as shown in FIG. 3, which are connected in a cascade fashion. As shown, an input signal is output through a route including first CMOS transfer gate 21, inverter 22, second CMOS transfer gate 23, and inverter 24. CMOS transfer gates 21 and 23 are each made up of a P channel MOS transistor and an N channel MOS transistor connected in parallel. The P channel transistor is coupled at the gate with delay control signal PV. The N channel transistor receives at the gate delay control signal NV. Resistance values of CMOS transfer gates 21 and 23 vary in accordance with delay control signals PV and NV, so that a delay amount of the ring oscillator is varied.

Figure 4:
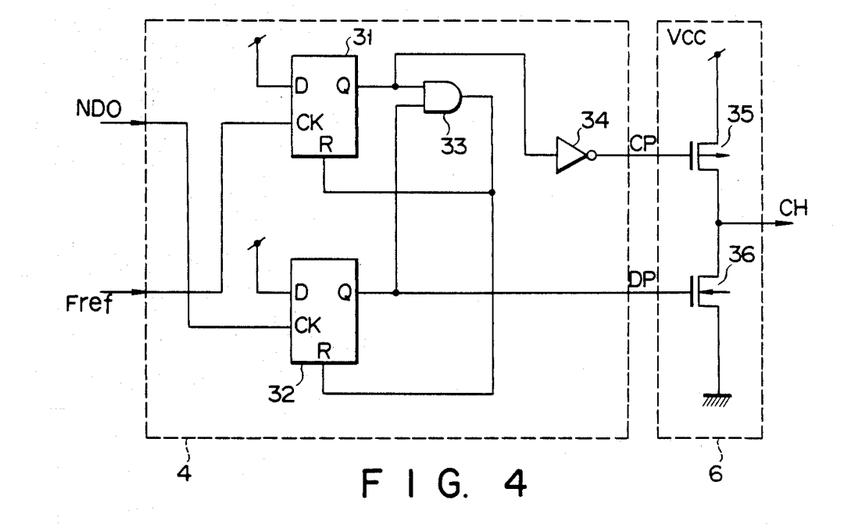
FIG. 4 is a circuit diagram showing the details of a phase comparator and a charge pump circuit in FIG. 2.

FIG. 4 is a circuit diagram showing the details of phase comparator 4 and charge pump circuit 6. Phase comparator 4 is made up of first and second D-type flip-flops 31 and 32, AND gate 33, and inverter 34. Charge pump circuit 6 is made up of P channel transistor 35 and N channel transistor 36, which are connected in series between a power source Vcc terminal and a ground terminal. Signal Fref is input to the clock input terminal CK of first D-type flip-flop 31, and the output signal NDO of inverter 5 (FIG. 2) is input to the clock input terminal CK of second D-type flip-flop 32. The output signals Q of those flip-flops 31 and 32 input to AND gate 33. AND gate 33 logically multiplies those output signals. The output signal representative of the logical product is input to the reset input terminals R of flip-flops 31 and 32. The output signal Q of first flip-flops 31 also is output to a first output CP of phase comparator 4 through inverter 34. The output Q of second flip-flop 32 is directly output to second output DP. First and second outputs CP and DP of phase comparator 4 are input to the gates of transistors 35 and 36 in charge pump circuit 6. Output signal CH is derived from a node between P channel MOS transistor 35 and N channel MOS transistor 36.

Figure 5A:
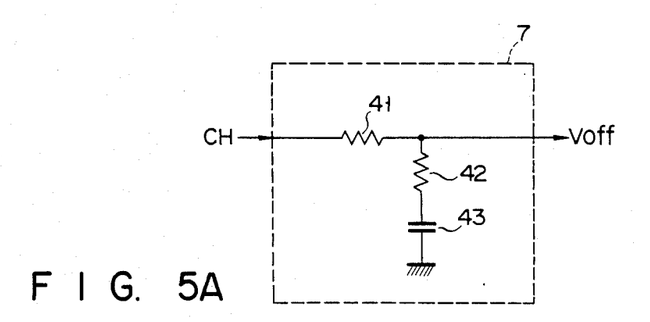
FIGS. 5A and 5B are circuit diagrams showing the details of different low-pass filters.
Figure 5B:
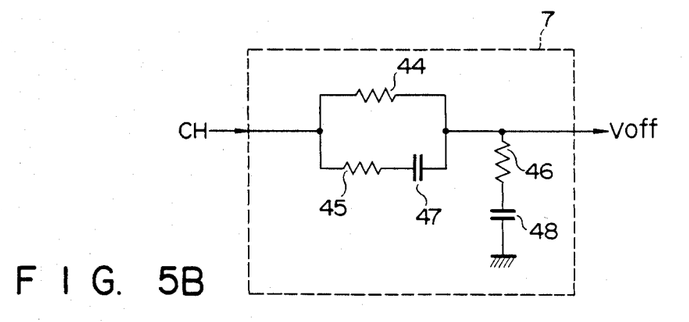

Low-pass filter 7 is constructed as shown in FIGS. 5A and 5B. The low-pass filter of FIG. 5A is comprised of resistor 41 connected between input and output terminals, and resistor 42 and capacitor 43 which are connected in series between the output terminal and a ground terminal. The low-pass filter of FIG. 5B comprises resistor 44 connected input and output terminals, a series circuit of resistor 45 and capacitor 47, which is coupled in parallel with resistor 44, and a series circuit of resistor 46 and capacitor 48, which is connected between the output terminal and a ground terminal. The low-pass filters of FIGS. 5A and 5B receive signal CH at the input terminals and output signal Voff at the output terminals.

Figure 6:
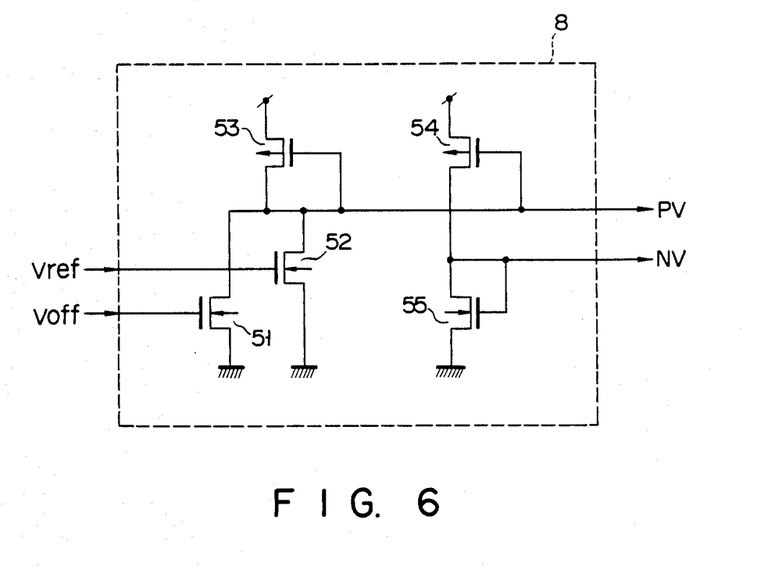
FIG. 6 is a circuit diagram showing a level converter in FIG. 2.

Level converter 8 is arranged as shown in FIG. 6. The level converter is comprised of N channel MOS transistor 51 receiving at the gate the output signal Voff from the low-pass filter, N channel MOS transistor 52 receiving signal Vref, P channel MOS transistor 53 serving as a load of transistors 51 and 52, P channel MOS transistor 54 whose gate is connected to a node of transistors 51, 52, and 53, and N channel MOS transistor 55 serving as a load of transistor 54. The gate and drain of transistor 53 are interconnected. The gate and drain of transistor 55 are interconnected. First output signal PV is derived from the drains of N channel transistors 51 and 52, and second output signal NV is derived from the drain of N channel transistor 55. Another level converter 9 has substantially the same arrangement as the above mentioned level converter 8, except that signal Voff is replaced by signal Vcont. Therefore, no description and illustration will be omitted, for simplicity.

Figure 7:
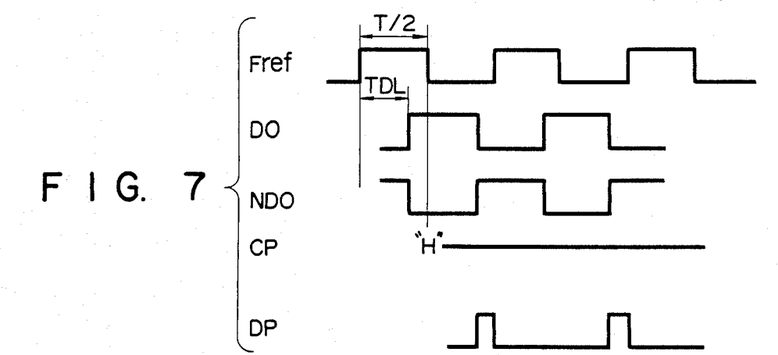
FIGS. 7 through 9 show signal charts of a PLL section.

The operation of PLL section 1 in the voltage controlled oscillator shown in FIG. 2 will be described. Let us first consider a case that delay time TDL of variable delay circuit 3 (more exactly, including a delay time of inverter 5) is shorter than T/2 (T is a period of reference input signal Vref), as shown in FIG. 7. In this case, the first output signal CP of phase comparator 4 maintains the high ("H") level. The second output signal DP becomes high in level when input signal Fref is low "L" in level and signal NDO is "H", that is, during a period of a shortae of the delay time TDL with respect to T/2. Under this condition, the charge stored in charge pump 6 is discharged, so that a potential of output signal Voff of low-pass filter 7 drops. Then, if reference signal Vref is at a fixed potential (e.g., ½ of power source potential Vcc), the first output signal PV of level converter 8 rises in potential, whereas the second output signal NV falls. As a result, a delay time of variable delay circuit 3 becomes large.

Figure 8:
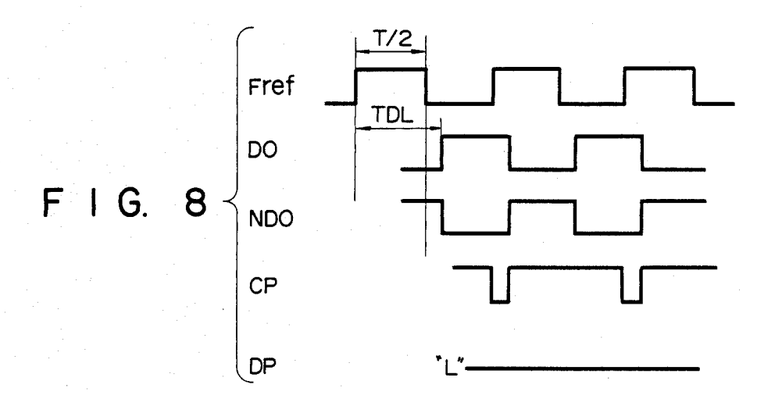

Let us consider another case that delay time TDL of variable delay circuit 3 is larger than T/2, as shown in FIG. 8. In this case, the second output signal DP of phase comparator 4 maintains the high level. The first output signal CP becomes low in level when signal NDO is "L", that is, during a period of an excess of delay time TDL with respect to T/2. Under this condition, the output terminal of charge pump 6 is charged up, so that a potential of output signal Voff of low-pass filter 7 rises. Then, if reference signal Vref is at a fixed potential, the first output signal PV of level converter 8 falls in potential, whereas the second output signal NV rises. As a result, a delay time of variable delay circuit 3 becomes small.

Figure 9:
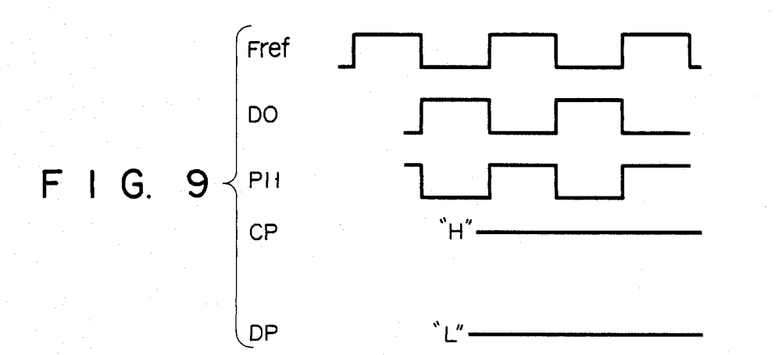

Let us consider yet another case that delay time TDL of variable delay circuit 3 is equal to T/2, and the PLL loop is in a locked state, as shown in FIG. 9. In this case, the output signal CP of phase comparator 4 is fixed at "H" and the output DP is fixed at "L". Neither discharge pulse nor charge pulse is generated. Under this condition, both the outputs PV and NV do not change, and a delay time of variable delay circuit 3 is kept constant.

In this way, a delay time of variable delay circuit 3 is very exactly controlled.

Next, the operation of VCO section 2 will be described. If input voltage signals Vcont and Vref are equal to each other, the input signal to level converter 9 is equal to that to first level converter 8. Accordingly, a delay time of delay circuit 10 is equal to that of the variable delay circuit 3 in PLL section 1. Assuming that a delay time of a basic delay circuit in delay circuit 10 is Tdl, and the number of the used basic delay circuits is "n", then an output frequency Fvco of ring oscillator 12 is given by $$FVCO = 1/2Tdl \cdot n).$$

As seen from the above relation, an output signal at a frequency, which is stable against the variance of process parameters, can be obtained by determining the number of the basic delay circuits in variable delay circuit 10 so that a desired output frequency Fvco' can be obtained when Vcont=Vref.

Figure 10:
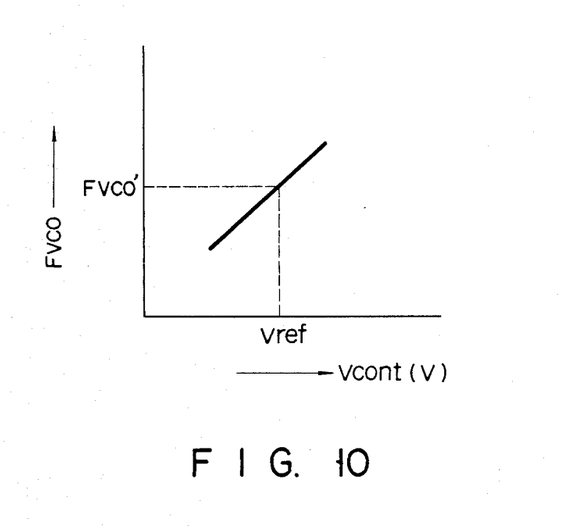
FIG. 10 is a graph showing a characteristic of a VCO section of the oscillator of FIG. 2.

If a level of voltage signal Vcont is varied, the output signals PV and NV of level converter 9 vary, delay time TDL of variable delay circuit 10 varies, and consequently output frequency Fvco varies. An example of the Vcont to Fvco characteristic is illustrated in FIG. 10. As seen, when input voltage signal Vcont varies, output frequency Fvco varies in proportion to the variation of the input voltage signal.

Figure 11:
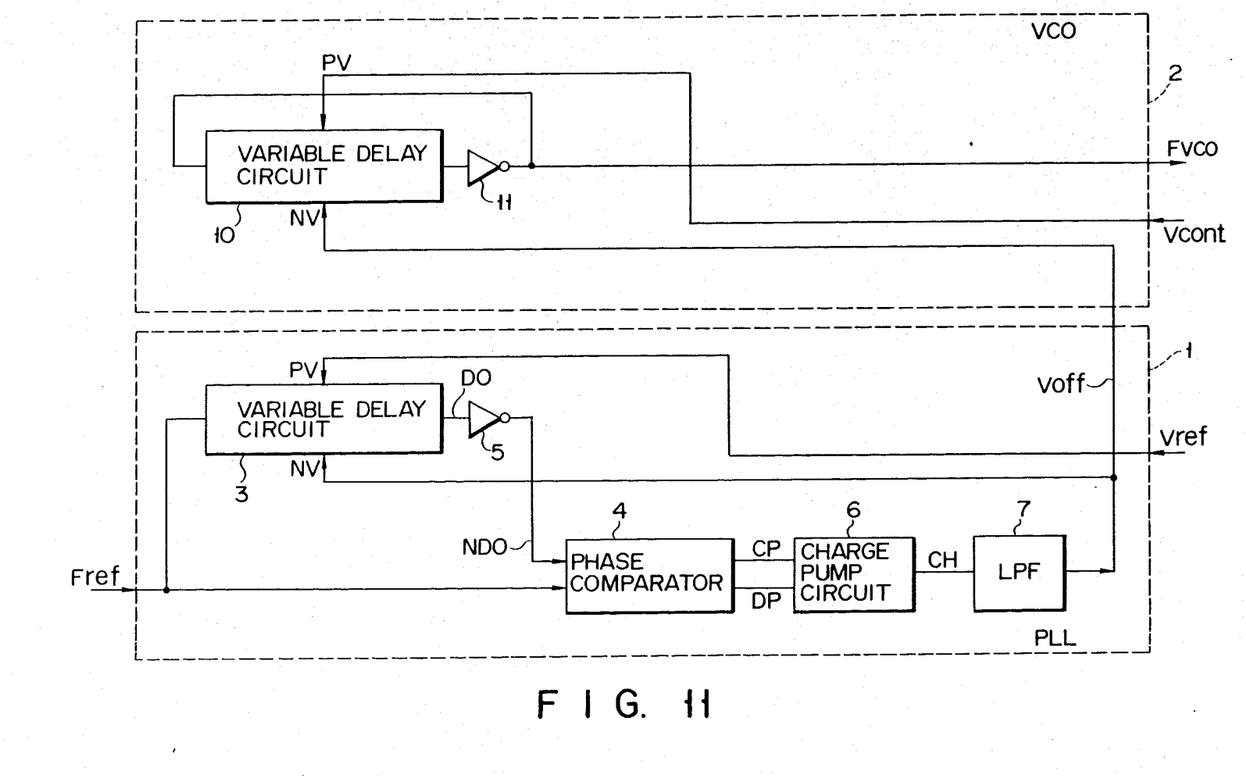
FIG. 11 is a block diagram showing a voltage controlled oscillator according to another embodiment of the present invention.

Turning now to FIG. 11, there is shown a voltage controlled oscillator according to another embodiment of the present invention. Major differences of this embodiment from the voltage controlled oscillator shown in FIG. 2 are as follows. In the voltage controlled oscillator of FIG. 11, level converters 8 and 9 are omitted. A delay time of first variable delay circuit 3 in PLL section 1 is controlled by reference potential input Vref and the output voltage Voff of the low-pass filter 7 in PLL section 1. A delay time of second variable delay circuit 10 in VCO section 2 is controlled by control voltage input Vcont and the output voltage Voff of the low-pass filter 7 in PLL section 1. In FIG. 11, like reference symbols are used for like portions in FIG. 2, for simplicity.

In the present embodiment, when first variable delay circuit 3 is constructed with a necessary number of basic circuits connected in a cascade fashion as shown in FIG. 3, reference potential input Vref is applied as the PV signal to the gates of P channel MOS transistors of CMOS transfer gates 21 and 23. The output voltage Voff of low-pass filter 7 is applied as the NV signal to the gates of the N channel transistors. Similarly, when second variable delay circuit 10 is constructed with a necessary number of basic circuits connected in a cascade fashion, control voltage input Vcont is applied as the PV signal to the gates of P channel MOS transistors of CMOS transfer gates 21 and 23. The output voltage Voff of low-pass filter 7 is applied as the NV signal to the gates of the N channel transistors.

Also in the voltage controlled oscillator of FIG. 11, as in that of the embodiment of FIG. 2, if reference potential input Vref is equal to control voltage input Vcont, a delay time of first variable delay circuit 3 is equal to that of second variable delay circuit 10, and hence an output signal may be obtained, which is stable against the variance of the process parameters. In the voltage controlled oscillator of FIG. 11, second variable delay circuit 10 is controlled directly by control voltage input Vcont. There is eliminated a limit of a variable range of the control voltage by level converter 9 used in the embodiment of FIG. 2. Therefore, the variable range of an output frequency of VCO section 2 is expanded.

In the embodiments as mentioned above, first and second variable delay circuits 3 and 10 are constructed with basic delay circuits containing equal constants. In this respect, a circuit design is easy. It is evident, however, that those basic delay circuits do not always have the same constants.

As seen from the foregoing description, in the voltage controlled oscillator according to the present invention, an output frequency is determined by controlling a delay time of the variable delay circuit, and the delay time is accurately controlled by the phase locked loop. Therefore, an output frequency is stable independent of the variance of the process parameters. The delay time is also changed by the frequency of the input signal as a reference frequency signal. Because of this feature, an oscillating frequency may be set at a desired frequency, and a frequency band of the oscillating frequency may also be set appropriately.

What is claimed is:

1. A voltage controlled oscillator comprising:
   a phase locked loop section coupled with an input signal at a reference frequency and a reference potential, said phase locked loop section performing a signal feedback control so as to obtain a constant delay time of a first variable delay circuit contained in said phase locked loop section; and
   a voltage controlled oscillator section for controlling a delay time of a second variable delay circuit in a ring oscillator by a control input voltage and an output voltage of a low-pass filter contained in said phase locked loop section, and producing a signal oscillating at a frequency as determined by the delay time.

2. A voltage controlled oscillator according to claim 1, in which said first and second variable delay circuits are constructed with a plurality of basic delay circuits containing equal constants.

3. A voltage controlled oscillator according to claim 1, in which a delay time of said second variable delay circuit is controlled by a signal resulting from the level conversion of said control voltage input and said output voltage.

4. A voltage controlled oscillator according to claim 3, in which said first and second variable delay circuits are constructed with a plurality of basic delay circuits containing equal constants.

5. A voltage controlled oscillator comprising:
   a phase locked loop including a first variable delay circuit coupled for reception with an input signal at a reference frequency, a phase comparing means for comparing the output signal of said first variable delay circuit and said input signal, and outputting an output voltage according to the comparison result, and a feedback circuit for applying said output voltage and said reference potential to said first variable delay circuit, thereby to control a delay of said first variable delay circuit;
   a voltage controlled oscillator section including a ring oscillator for producing a frequency output, said ring oscillator containing a second variable delay circuit, and a feedback loop for applying the output voltage of said phase comparing means and the control voltage to said second variable delay circuit, thereby to control a delay time of said second variable delay circuit.

6. A voltage controlled oscillator according to claim 5, in which said first and second variable delay circuits are constructed with a plurality of basic delay circuits containing equal constants.

7. A voltage controlled oscillator according to claim 5, in which said ring oscillator includes a looped circuit made up of said second variable delay circuit and an inverter for inverting a phase of the output signal of said second variable delay circuit.

8. A voltage controlled oscillator comprising:
   a phase locked loop including a first variable delay circuit coupled for reception with an input signal at a reference frequency, a phase comparing means for comparing the output signal of said first variable delay circuit and said input signal, and outputting an output voltage according to the comparison result, and a feedback loop for level converting said output voltage and a control voltage and applying the level converted output signals to said first variable delay circuit, thereby to control a delay time of said first variable delay circuit;
   a voltage controlled oscillator section including a ring oscillator for producing a frequency output, and ring oscillator containing a second variable delay circuit, and a feedback loop for level converting said output voltage and said reference potential and applying the level converted output signals to said second variable delay circuit, thereby to control a delay of said second variable delay circuit.

9. A voltage controlled oscillator according to claim 8, in which said first and second variable delay circuits are constructed with a plurality of basic delay circuits containing equal constants.

10. A voltage controlled oscillator according to claim 8, in which said ring oscillator includes a looped circuit made up of said second variable delay circuit and an inverter for inverting a phase of the output signal of said second variable delay circuit.

* * * * *